United States Patent
Park et al.

(10) Patent No.: US 6,875,096 B2
(45) Date of Patent: Apr. 5, 2005

(54) CHEMICAL MECHANICAL POLISHING PAD HAVING HOLES AND OR GROOVES

(75) Inventors: Inha Park, Ulsan (KR); Tae-Kyoung Kwon, Ulsan (KR); Jaeseok Kim, Ulsan (KR)

(73) Assignee: SKC Co., Ltd., Kyunggi-do (KR)

(*) Notice: Subject to any disclaimer, the term of this patent is extended or adjusted under 35 U.S.C. 154(b) by 231 days.

(21) Appl. No.: 10/110,802

(22) PCT Filed: Aug. 29, 2001

(86) PCT No.: PCT/KR01/01465

§ 371 (c)(1),
(2), (4) Date: Sep. 3, 2002

(87) PCT Pub. No.: WO03/017348

PCT Pub. Date: Feb. 27, 2003

(65) Prior Publication Data

US 2004/0058630 A1 Mar. 25, 2004

(30) Foreign Application Priority Data

Aug. 16, 2001 (KR) .................................. 2001-49355

(51) Int. Cl.$^7$ ............................................. B24D 11/00
(52) U.S. Cl. ....................................... 451/527; 451/530
(58) Field of Search ................................. 451/526, 527, 451/530, 41, 921, 446

(56) References Cited

U.S. PATENT DOCUMENTS

| | | | | |
|---|---|---|---|---|
| 5,020,283 A | * | 6/1991 | Tuttle | 451/550 |
| 5,297,364 A | * | 3/1994 | Tuttle | 451/527 |
| 5,329,734 A | * | 7/1994 | Yu | 451/41 |
| 5,984,769 A | * | 11/1999 | Bennett et al. | 451/527 |
| 6,165,904 A | * | 12/2000 | Kim | 438/692 |
| 6,238,271 B1 | * | 5/2001 | Cesna | 451/41 |
| 6,656,019 B1 | * | 12/2003 | Chen et al. | 451/41 |

* cited by examiner

Primary Examiner—Robert A. Rose
(74) Attorney, Agent, or Firm—Abelman, Frayne & Schwab

(57) ABSTRACT

Disclosed is a chemical mechanical polishing pad formed with holes, grooves or a combination thereof. The chemical mechanical polishing pad is characterized in that a plurality of concentric circles each having grooves, holes, or a combination thereof are formed at a polishing surface of the polishing pad. The chemical mechanical polishing pad provides effects of effectively controlling a flow of slurry during a polishing process, thereby achieving a stability in the polishing process in terms of a polishing rate, and achieving an enhancement in the planarization of a wafer.

7 Claims, 8 Drawing Sheets

* Debris
♦ Slurry

CHEMICAL MECHANICAL POLISHING PAD HAVING HOLES AND OR GROOVES

TECHNICAL FIELD

The present invention relates to a polishing pad used in a chemical mechanical polishing process, and more particularly to a chemical mechanical polishing pad formed at a polishing surface thereof with a plurality of concentric circles each having grooves, holes, or a combination thereof.

BACKGROUND ART

Generally, chemical mechanical polishing (CMP) is a high precision/mirrored surface polishing method used to obtain global planarization in a semiconductor device manufacturing process. In accordance with such CMP, a slurry is supplied between a polishing pad and a wafer to be polished, so as to chemically etch the surface of the wafer. Using the polishing pad, the etched surface of the wafer is mechanically polished.

Referring to FIG. 1, a typical CMP machine, which is denoted by the reference numeral 1, is schematically illustrated. Also, a CMP method using the CMP machine 1 is schematically illustrated in FIG. 2. The CMP method includes a chemical etching reaction process and a mechanical polishing process, which are conducted using a polishing pad 10 included in the CMP machine 1. The chemical etching reaction is carried out by a slurry 42. That is, the slurry 42 serves to chemically react with the surface of a wafer 30 to be polished, thereby making it possible for the mechanical polishing process, following the chemical etching reaction, to be easily carried out. In the mechanical polishing process, the polishing pad 10, which is fixedly mounted on a platen 20, rotates. The wafer 30, which is firmly held by a retainer ring 32, rotates while oscillating. A slurry containing abrasive particles is supplied to the polishing pad 10 by a slurry supply means 40. The supplied slurry is introduced between the polishing pad 10 and the wafer 30. The introduced abrasive particles come into frictional contact with the wafer 30 by virtue of a relative rotating speed difference between the polishing pad 10 and the wafer 30, so that they conduct mechanical polishing. The slurry 42 is a colloidal liquid containing abrasive particles having a grain size of nanometers. This slurry 42 is spread on the polishing pad 10 during the polishing process. As the polishing pad 10 rotates during the polishing process, the slurry 42 supplied to the polishing pad 10 is outwardly discharged from the periphery of the polishing pad 10 due to a centrifugal force caused by the rotation of the polishing pad 10. In order to achieve an enhanced polishing efficiency, many abrasive particles should remain for a desirable lengthy period of time on the upper surface of the polishing pad 10 so that they. participate in the polishing of the wafer. That is, the polishing pad 10 should make the slurry 42 be held on the surface thereof for as long a period of time as possible.

Centrifugal force generated during the rotation of the CMP pad is higher at a position nearer to the periphery of the polishing pad. Due to such a centrifugal force difference between different radial positions on the polishing pad, the slurry on the polishing pad exhibits an increased flow rate as it approaches the periphery of the polishing pad. Thus, the slurry is non-uniformly distributed in the radial direction of the polishing pad. Due to such a non-uniform distribution of the slurry, the wafer is non-uniformly polished because its polishing rate is varied depending on a radial position of the polishing pad in contact with the wafer's surface. Such a variation in polishing rate affects the planarization of the wafer. As a result, the polishing pad exhibits a considerable difference in polishing rate between its central portion and its peripheral portion. For this reason, it is necessary to uniformly distribute the slurry over the polishing pad by controlling the flow of slurry on the polishing pad.

During the polishing process, the wafer is pressed against the polishing pad so that it comes into frictional contact with abrasive particles. Due to this pressure, however, it may be difficult for the slurry to reach the central portion of the wafer. For this reason, the slurry may be distributed at the central portion of the wafer in a relatively reduced amount, as compared to the amount at the peripheral portion of the wafer. As a result, the wafer is non-uniformly polished.

In order to solve such a problem, a method has been proposed, in which holes or grooves having a desired width, depth and shape are formed on a CMP pad. Such holes or grooves act to control the flow and distribution of the slurry continuously supplied during the polishing process.

Now, holes or grooves conventionally formed on a polishing pad will be described in conjunction with the annexed drawings.

FIG. 3a is a schematic view illustrating a polishing pad formed with grooves respectively having the form of concentric circles. FIG. 3b is a cross-sectional view taken along the line A—A of FIG. 3a. As shown in FIGS. 3a and 3b, the grooves formed on the polishing pad have the form of concentric circles uniformly spaced apart from one another in a radial direction while having different diameters, respectively. The slurry, which is continuously supplied onto the polishing pad, is forced to move outwardly by a centrifugal force generated as the polishing pad rotates. As a result, during the polishing process, the slurry is temporarily collected in the concentric circular grooves, and then outwardly discharged from those grooves. An example of such concentric circular grooves is disclosed in U.S. Pat. No. 5,984,769. This U.S. Pat. No. 5,984,769 discloses a polishing pad formed with a plurality of concentric circular grooves or spiral grooves. The polishing pad is divided into a plurality of groove regions where grooves having different widths and different lengths are formed, respectively. However, such a polishing pad having circular or spiral grooves cannot meet various conditions required in a CMP process because it has a fixed pattern formed only of grooves.

FIG. 4a is a schematic view illustrating a polishing pad formed with holes having a conventional structure. FIG. 4b is a cross-sectional view illustrating holes shown in FIG. 4a. In the polishing pad of FIG. 4a, a plurality of holes are regularly arranged. The holes arranged on the polishing pad store a slurry supplied thereto, thereby retarding a discharge of the stored slurry caused by centrifugal force. U.S. Pat. No. 5,853,317 discloses a polishing pad formed with grooves at a first surface thereof serving as a polishing surface to polish an object and grooves at a second surface fixedly mounted to a platen in such a fashion that the grooves formed at the second surface have a larger size than the grooves formed at the first surface. Also, U.S. Pat. No. 5,329,734 discloses a polishing pad having a first region formed with a plurality of pores and a second region formed with a plurality of openings.

In the case of the conventional polishing pad having grooves or holes uniformly spaced apart from one another, the slurry supplied onto the polishing pad is hindered from flowing toward the central portion of a wafer being polished at regions where the polishing pad is in contact with the wafer. As a result, a degradation in polishing rate occurs at the central portion of the wafer.

On the other hand, in the case of the conventional polishing pad having concentric circular grooves, a superior slurry storage capacity is obtained because each groove has a partially closed structure having vertical groove walls capable of retaining the slurry in the groove against centrifugal force, as compared to other conventional polishing pads. However, this polishing pad has a drawback in that each groove has an insufficient depth corresponding to ¼ of the thickness of the polishing pad.

Since the grooves or holes formed on the above mentioned conventional polishing pads have a fixed pattern such as concentric circles or a lattice, it is difficult to form a groove pattern capable of effectively controlling the flow of a slurry. In accordance with the method for forming perforations using perforating pins, the perforations have a fixed shape. Since the holes have a simple and fixed pattern, it is difficult to arrange them to have diverse hole patterns desired in a CMP process.

In order to solve such problems, accordingly, it is necessary to design the shape, density and distribution of grooves or holes, taking into consideration the given polishing process conditions such as centrifugal force and wafer position.

DISCLOSURE OF THE INVENTION

Therefore, an object of the invention is to provide a CMP pad for a CMP process which is formed with holes, grooves or a combination thereof capable of retarding the discharge rate of a slurry supplied onto a polishing surface while uniformly distributing the slurry over the polishing surface.

Another object of the invention is to provide a CMP pad formed with holes, grooves or a combination thereof capable of effectively controlling the flow of a slurry supplied onto the polishing pad during a CMP process.

In accordance with the present invention, these objects are accomplished by providing a CMP pad used for a CMP process, wherein a plurality of concentric circles each having grooves, holes, or a combination thereof are formed at a polishing surface of the pad.

BRIEF DESCRIPTION OF THE DRAWINGS

FIG. 3b is a cross-sectional view taken along the line A—A of FIG. 3a;

FIG. 4b is a cross-sectional view illustrating holes shown in FIG. 4a;

BEST MODE FOR CARRYING OUT THE INVENTION

Now, the present invention will be described in detail in terms of its constitution and function, with reference to the annexed drawings.

Figure 1:
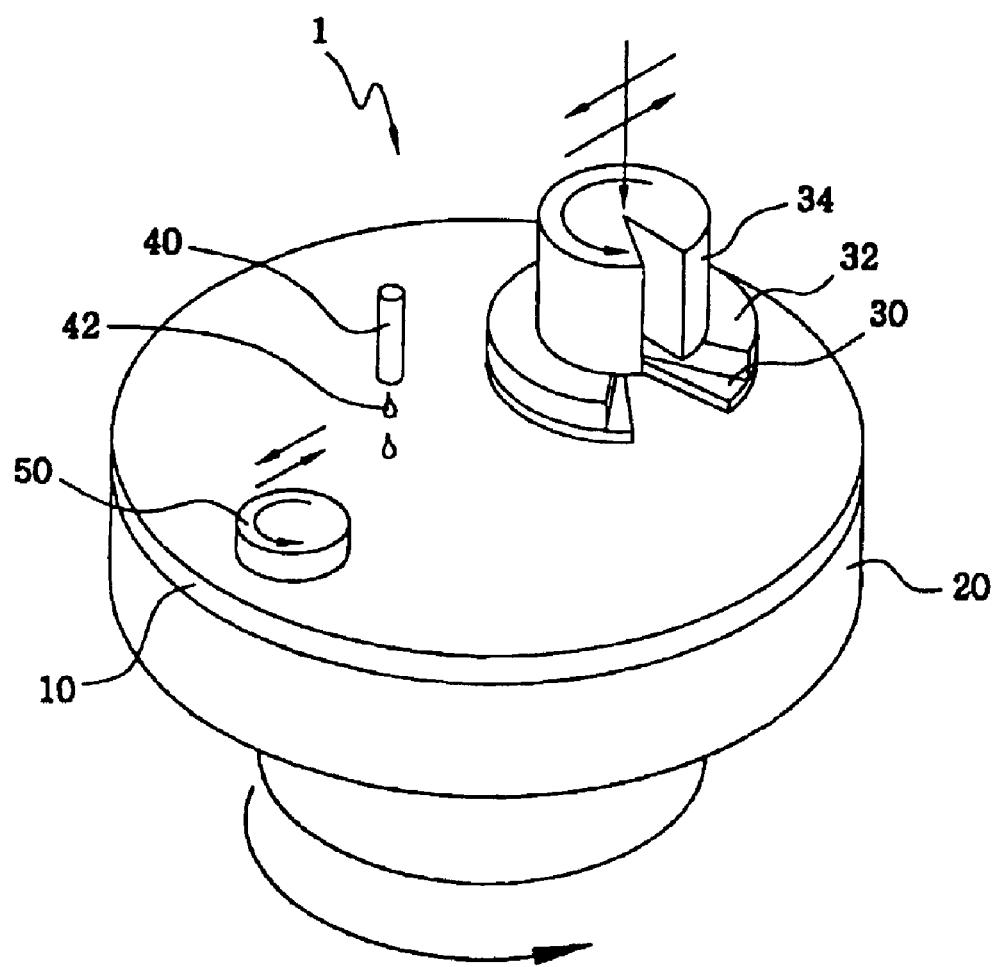
FIG. 1 is a schematic view illustrating the configuration of a typical CMP machine and a polishing method performed using the CMP machine.
Figure 2:
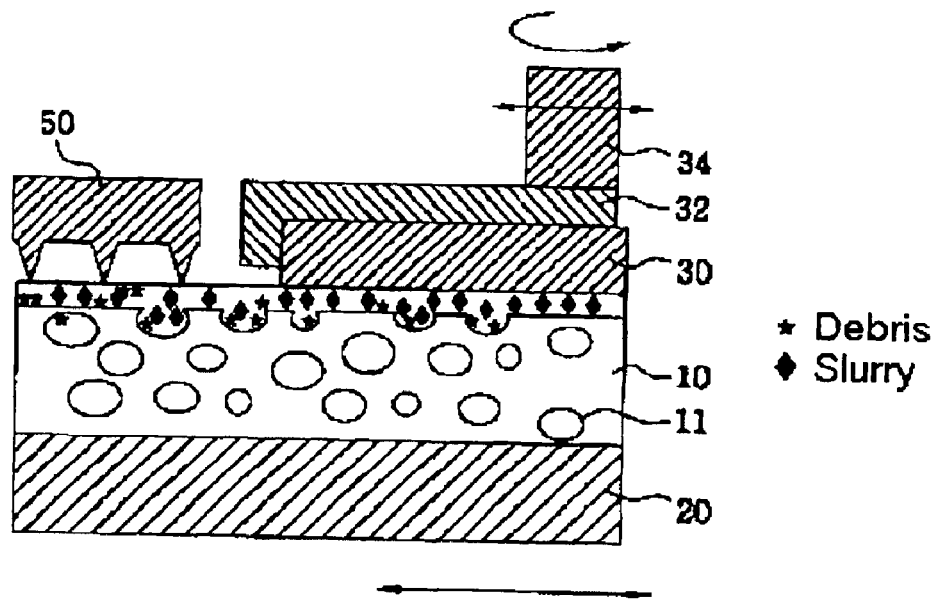
FIG. 2 is a schematic view illustrating the concept of a CMP method.
Figure 3A:
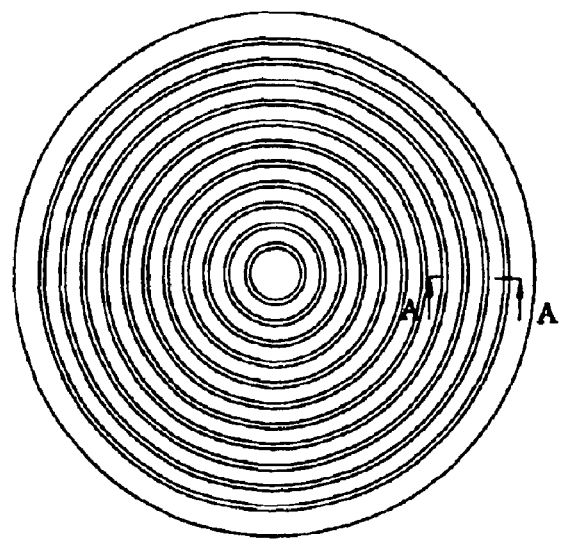
FIG. 3a is a schematic view illustrating a polishing pad formed with grooves respectively having the form of concentric circles.
Figure 3B:
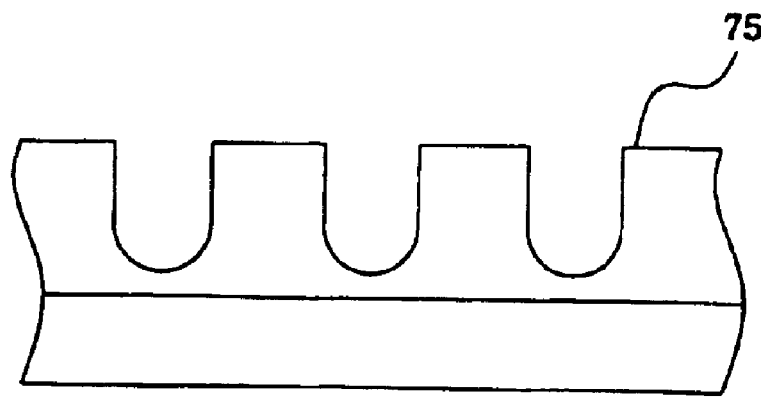
Figure 4A:
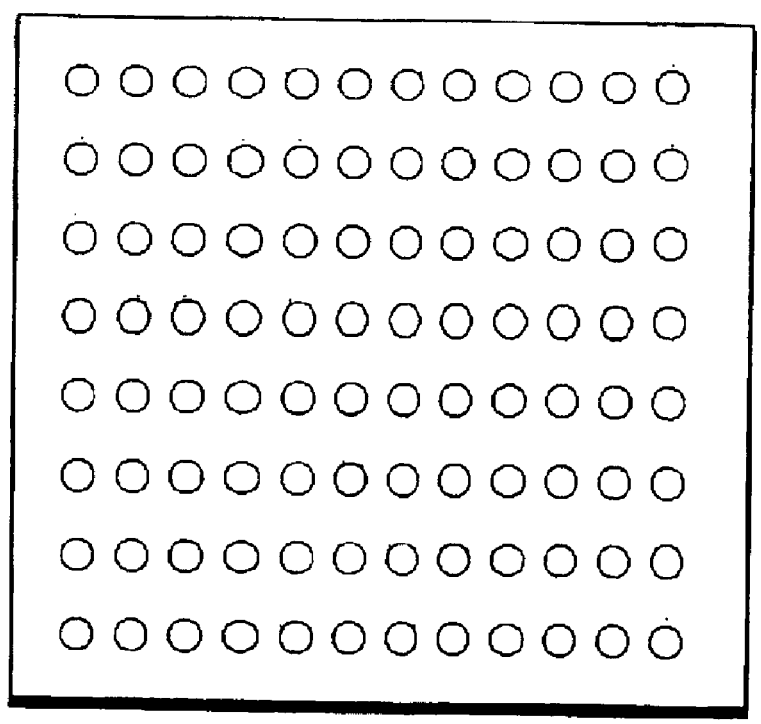
FIG. 4a is a schematic view illustrating a polishing pad formed with holes having a conventional structure.
Figure 4B:
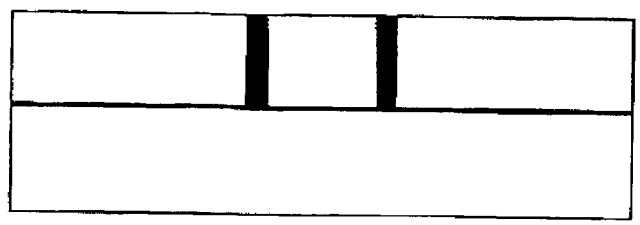
Figure 5:
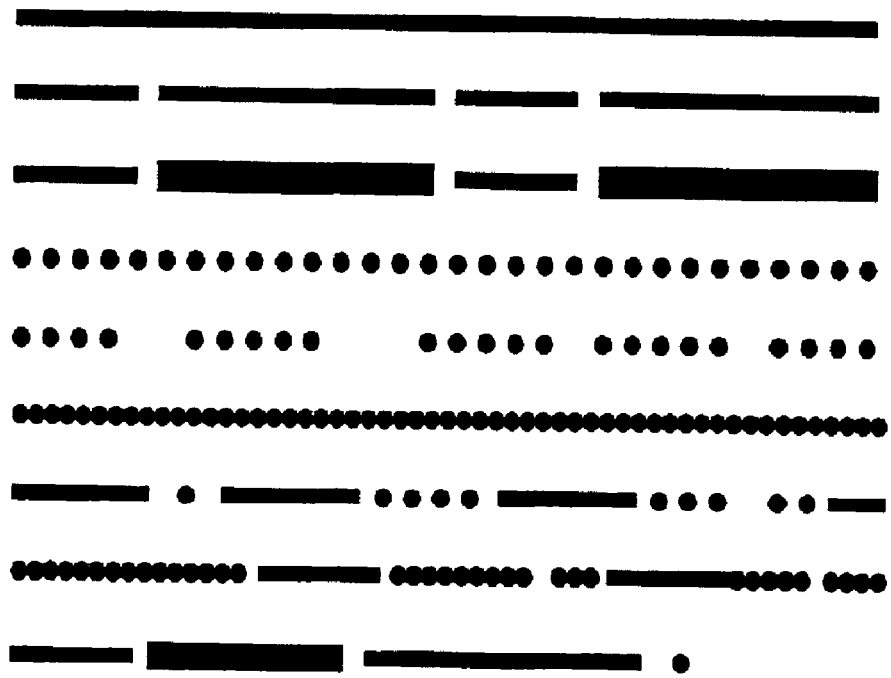
FIG. 5 is a schematic view illustrating diverse shapes of grooves, holes or combinations thereof formed in accordance with the present invention.

In accordance with the present invention, a CMP pad is provided which has, at a polishing surface thereof, a plurality of concentric circles each having grooves, holes, or a combination thereof. Referring to FIG. 5, diverse shapes of such grooves, holes or combinations thereof arranged in the form of a concentric circle in accordance with the present invention are illustrated.

In accordance with the present invention, continuous grooves each having a desired width and a desired depth may be formed to have the form of concentric circles, respectively. Such continuous grooves are disclosed in U.S. Pat. No. 5,984,769. In the case of a polishing pad disclosed in U.S. Pat. No. 5,984,769, a plurality of uniformly spaced concentric circular grooves are formed.

In accordance with the present invention, discontinuous grooves each having a desired width, depth and length may be formed which are regularly arranged while being spaced apart from one another. These grooves may be uniformly spaced apart from one another by a predetermined distance. Alternatively, the grooves may be regularly or irregularly arranged while being uniformly or non-uniformly spaced apart from one another. Also, the grooves may have different depths, widths, or lengths, respectively. Typically, each groove may have a rectangular cross-sectional shape. Of course, each groove may have other cross-sectional shapes, for example, an inverted triangular shape.

Alternatively, a plurality of holes, which have a desired depth and diameter, may be arranged to have a uniform space between the centers of adjacent ones thereof in accordance with the present invention. Where the space between adjacent holes is smaller than radius of the holes, the holes have a continuous arrangement. The space between adjacent holes can be adjusted to be increased or reduced. In addition, the polishing pad of the present invention may have hole groups each having at least two holes spaced apart from each other by a distance of r1. In this case, the hole groups may be regularly arranged while being uniformly spaced apart from one another by a desired distance of r2 (r2>r1). In this case, the holes may also be non-uniformly spaced apart from one another, as in the grooves. Also, the holes may have different depths, diameters, or shapes, respectively.

In accordance with the present invention, a combination of holes and grooves may be formed. The combination of holes and grooves may include combinations of grooves and holes having diverse patterns. That is, the polishing pad of the present invention may have a number of different patterns each formed by a combination of holes and grooves. For example, holes each having a desired depth and diameter and grooves each having a desired depth, width, and length may be alternately arranged while being spaced apart from one another.

Each pattern formed by grooves, holes or a combination thereof forms a concentric circle. Various examples of such a concentric circle formed by grooves, holes, or a combination thereof are illustrated in FIGS. 6a to 6d, respectively.

Figure 6A:
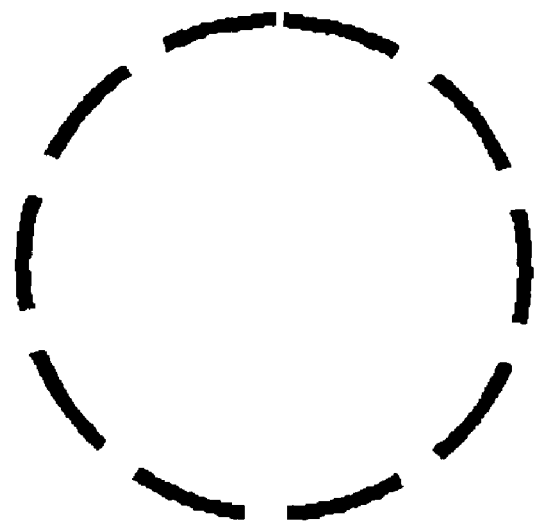
FIGS. 6a to 6d are schematic views illustrating various examples of a concentric circle formed by grooves, holes, or a combination thereof, respectively.
Figure 6B:
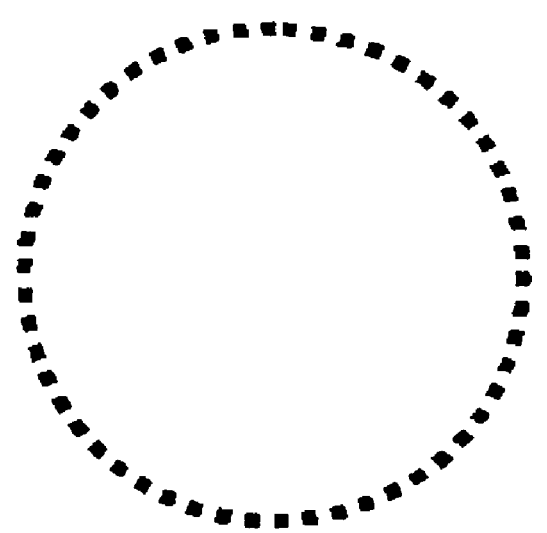
Figure 6C:
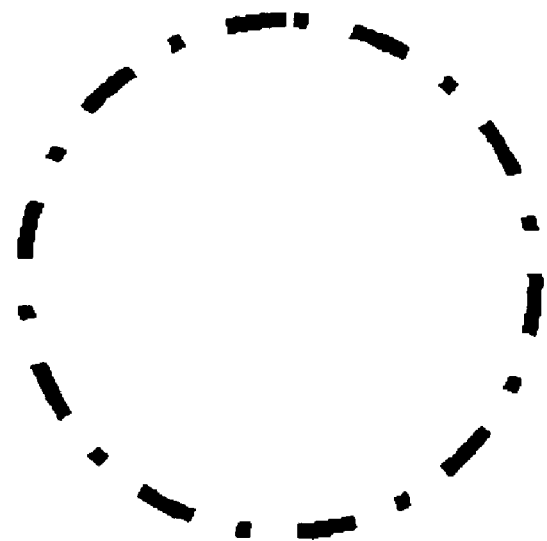
Figure 6D:
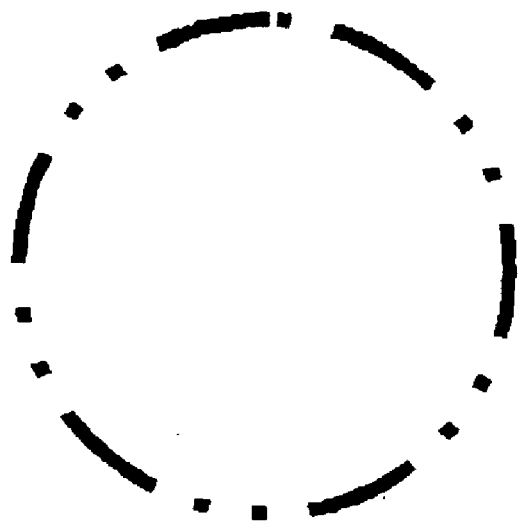

FIG. 6a shows a concentric circle formed by a plurality of grooves having a desired width and length while being uniformly spaced apart from one another. FIG. 6b shows a concentric circle formed by a plurality of holes having a desired width and length while being uniformly spaced apart from one another. FIGS. 6c and 6d show concentric circles each formed by a combination of grooves and holes, respectively. In the concentric circle of FIG. 6c, grooves and holes are regularly arranged in such a fashion that one groove alternates with one hole while being uniformly spaced apart from one another. In the concentric circles of FIG. 6d, grooves and holes are regularly arranged in such a fashion that two holes alternate with one groove while being uniformly spaced apart from one another.

The concentric circles respectively shown in FIGS. 6a to 6d are only for illustrative purposes. In accordance with the present invention, it is possible to form concentric circles having diverse patterns each composed of holes, grooves or a combination thereof having diverse shapes.

Thus, the CMP pad of the present invention may be formed with a plurality of concentric circles of different diameters each having grooves, holes, or a combination thereof.

In accordance with the present invention, the concentric circles formed on the polishing pad may have identical or different patterns each composed of grooves, holes, or a combination thereof. Also, the concentric circles may have the same pattern at a certain region of the polishing pad while having different patterns at other regions.

The space between adjacent concentric circles formed on the polishing pad may be uniform or nonuniform. Also, the circle space may vary gradually in accordance with the circle radius. For example, the circle space may be gradually reduced from the central portion to the peripheral portion of the polishing pad while being inversely proportional to an increase in circle radius.

Figure 7:
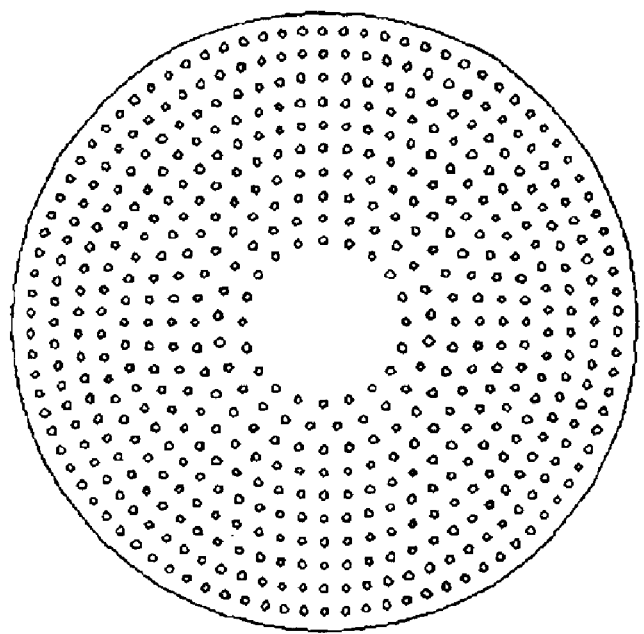
FIG. 7 is a schematic view illustrating a polishing pad having a plurality of concentric circles of different diameters each composed of a plurality of holes.

FIG. 7 illustrates a polishing pad formed with a plurality of concentric circles of different diameters each having a plurality of holes. In this case, the holes of the concentric circles have the same diameter and the same hole space. The concentric circles also have the same circle space. Of course, various modifications are possible by adjusting the depth, diameter, or space of the holes forming each concentric circle or the circle space, thereby varying the hole pattern of the polishing pad.

Figure 8:
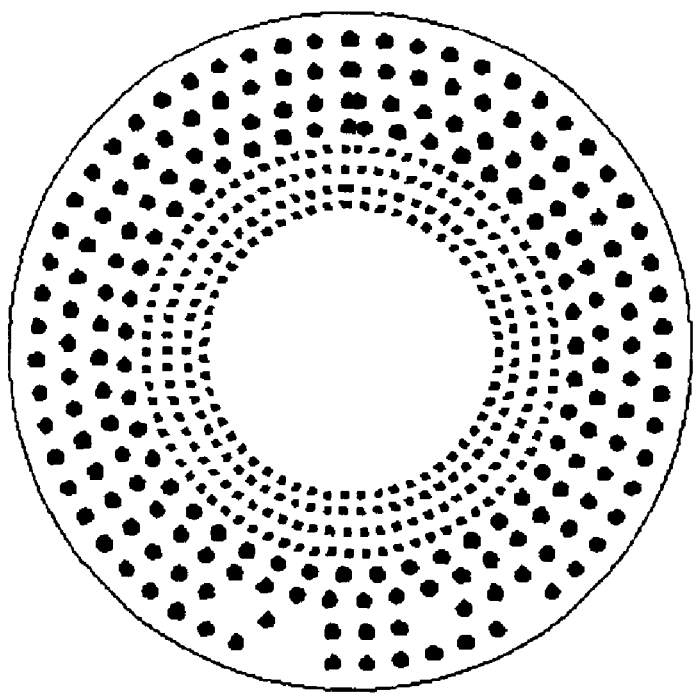
FIG. 8 is a schematic view illustrating a polishing pad which is divided into two radial regions each having a plurality of concentric circles of different diameters each composed of a plurality of holes.

In accordance with the present invention, the polishing pad may be divided into a plurality of radial regions. Referring to FIG. 8, a polishing pad is illustrated which is divided into two radial regions.

Each radial region of the polishing pad may be formed with a plurality of concentric circles having different diameters while having the same pattern. The radial regions may have different patterns or different depths, widths or spaces of grooves or holes.

For example, the polishing pad may be divided into inner and outer radial regions respectively defined at opposite sides of a circle having a radius $r_0$. The inner radial region has a radius smaller than the radius $r_0$ ($r<r_0$) whereas the outer radial region has a radius larger than the radius $r_0$($r>r_0$). Each of the inner and outer radial regions is formed with concentric circles having different radii while being composed of holes having the same diameter and the same hole space. The outer radial region may have a larger hole diameter and hole space than those of the inner radial region.

Figure 9:
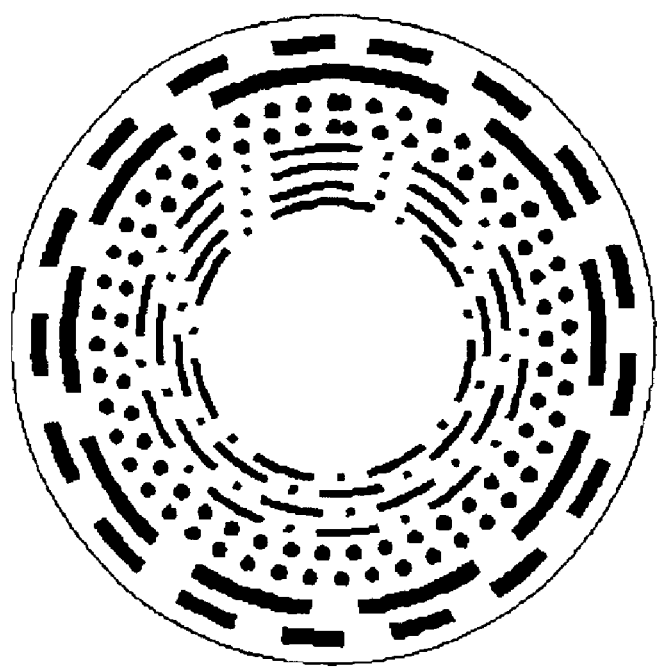
FIGS. 9 and 10 are schematic views respectively illustrating CMP pads each having a plurality of concentric circles of different diameters each composed of grooves, holes, or a combination thereof.
Figure 10:
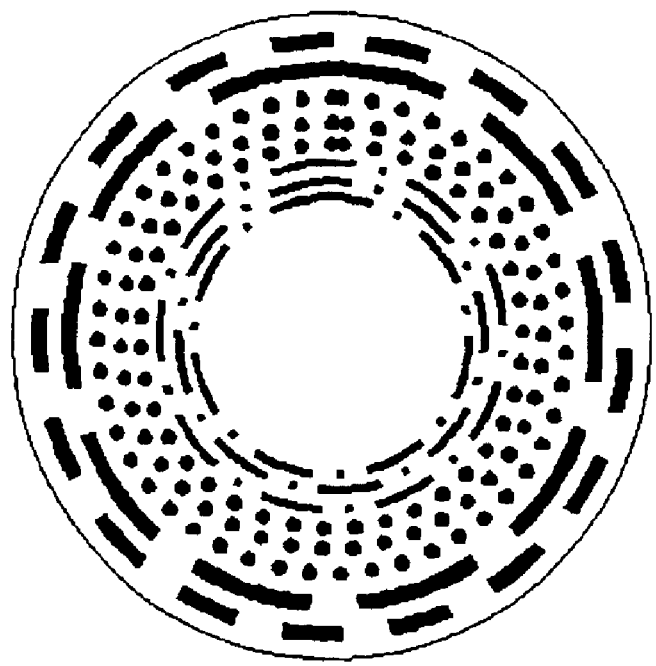

FIGS. 9 and 10 illustrate embodiments of the present invention associated with CMP pads each formed with a plurality of concentric circles of different diameters having grooves, holes, or a combination thereof.

In either case, holes and/or grooves can be formed to have diverse patterns capable of optimally meeting the given polishing process conditions.

Preferably, the formation of holes, grooves or a combination thereof is achieved using a laser machining process. The laser machining process provides advantages in that it is capable of precisely machining holes or grooves having a complicated structure, making the holes and/or grooves have a smooth inner surface, and easily adjusting the shape, size, and depth of the holes and/or grooves.

Of course, the machining of holes, grooves or a combination thereof may be achieved by a cutting or milling process using mechanical means in accordance with the present invention. Also, the machining process may be achieved using a combination of a laser machining method and a mechanical machining method.

INDUSTRIAL APPLICABILITY

As apparent from the above description, the present invention provides a polishing pad for a CMP process which is formed with holes, grooves or a combination thereof having diverse shapes, sizes, and patterns while being capable of retarding the discharge rate of a slurry supplied onto a polishing surface, uniformly distributing the slurry over the polishing surface, and effectively controlling the flow of the slurry during the CMP process, thereby stably maintaining a desired polishing rate and achieving an improved planarization.

Although the preferred embodiments of the invention have been disclosed for illustrative purposes in conjunction with a hole and/or groove pattern formed on a polishing pad used in a CMP process, those skilled in the art will appreciate that various modifications, additions and substitutions are possible, without departing from the scope and spirit of the invention as disclosed in the accompanying claims.

What is claimed is:

1. A chemical mechanical polishing pad for use in a chemical mechanical polishing process, wherein a plurality of concentric circles each having grooves, holes, or a combination thereof are formed at a polishing surface of the pad, and the concentric circles are non-uniformly spaced apart from one another so that the space defined between adjacent ones of the concentric circles is gradually reduced from a central portion of the pad to a peripheral portion of the pad.

2. The chemical mechanical polishing pad according to claim 1, wherein each of the concentric circles has a plurality of discontinuous grooves arranged to be spaced apart from one another, each of the grooves having a desired depth, a desired width, and a desired length.

3. The chemical mechanical polishing pad according to claim 2, wherein the grooves are different in at least one of their depth, width, and length.

4. The chemical mechanical polishing pad according to claim 1, wherein the grooves, holes, or combination thereof are machined by a laser.

5. The chemical mechanical polishing pad according to claim 1, wherein each of the concentric circles has a plurality of holes arranged to be spaced apart from one another, each of the holes having a desired depth and a desired diameter.

6. The chemical mechanical polishing pad according to claim 5, wherein the holes are different in respect of at least one dimension selected from the group consisting of their depth and and diameter, and the holes of at least one concentric circle are arranged so that the space between adjacent holes is different from other spaces in the same concentric circle.

7. The chemical mechanical polishing pad according to claim 1, wherein each of the concentric circles has a combination of holes having a desired depth, a desired diameter, and a desired space defined between adjacent ones thereof and grooves having a desired depth, a desired width, and a desired length, the holes and grooves being alternately arranged while being spaced apart from one another to alternate at least one of the holes with one of the grooves.

* * * * *